United States Patent [19]
Almasi

[11] 3,983,547
[45] Sept. 28, 1976

[54] THREE-DIMENSIONAL BUBBLE DEVICE
[75] Inventor: George S. Almasi, Katonah, N.Y.
[73] Assignee: International Business Machines - IBM, Yorktown Heights, N.Y.
[22] Filed: June 27, 1974
[21] Appl. No.: 483,500

[52] U.S. Cl. .................... 340/174 TF; 340/174 NC
[51] Int. Cl.² ........................................ G11C 11/14
[58] Field of Search.............. 340/174 TF, 174 MA, 340/174 NC

[56] References Cited
UNITED STATES PATENTS

| | | | |
|---|---|---|---|
| 3,195,116 | 7/1965 | Weisz et al. | 340/174 NC |
| 3,701,132 | 10/1972 | Bonyhard et al. | 340/174 NC |
| 3,751,597 | 8/1973 | Bonyhard | 340/174 TF |
| 3,878,542 | 4/1975 | Myer | 340/174 TF |

FOREIGN PATENTS OR APPLICATIONS

| | | | |
|---|---|---|---|
| 1,368,333 | 6/1964 | France | 340/174 MA |
| 1,474,319 | 9/1969 | Germany | 340/174 NC |

Primary Examiner—James W. Moffitt
Attorney, Agent, or Firm—Pollock, Vande Sande & Priddy

[57] ABSTRACT

A three-dimensional magnetic bubble device formed by depositing, on a flexible substrate, a plurality of pseudo-chips of amorphous metallic film capable of supporting magnetic bubbles. These pseudo-chips are interconnected by thin-film conductors also deposited on the flexible substrate. The substrate is then folded, on itself, a number of times to produce a three-dimensional magnetic bubble device. Optionally, a low temperature lamination step can be employed to complete the process. The folding step or steps, result in a number of layers, to which a common rotating magnetic field may be applied for propagation purposes.

7 Claims, 5 Drawing Figures

THREE-DIMENSIONAL BUBBLE DEVICE

FIELD OF THE INVENTION

The present invention relates to magnetic bubble devices and more particularly to a three-dimensional magnetic bubble device and a process for the fabrication thereof.

BACKGROUND OF THE INVENTION

The existence of single-wall magnetic domains in particular materials under certain conditions has been reported in the literature as well as in many patents. The potential for using the single-wall domain or bubble devices for information storage and logic functions for electronic computers and the like has also been studied. The primary goal in using magnetic bubble devices is the same as that for using any new material, i.e., reducing unit cost without sacrificing performance. Some of the problems foreseen in using magnetic bubble devices are similar to the problems encountered in conventional data processing components such as the problem of connecting a component in a system to other similar cooperating components. Since cost is related to size many commercial electronic data processing components have been reduced to almost microscopic size, such as integrated circuits. This small size, although a blessing from the cost standpoint, causes problems in making connections to the components. Similarly, bubble devices must be provided with signals for control, data read-in and data readout. In the design and fabrication of any such bubble device, of course, the manner of providing these connections must be taken into account.

A majority of the bubble devices that have been proposed in the past have been two dimensional, that is, essentially planar. However, it is generally understood that three-dimensional information storage is a more economical and efficient type of storage device. For instance, most of the bubble devices now being experimented with require an in-plane rotating magnetic field for purposes of propagation. The magnetic field acting in a thin patterned permalloy layer creates magnetic poles causing the bubbles to propagate in preferred directions as determined by the pattern. However, the rotating magnetic field in such arrangements is only effective in the thin layer in which the permalloy lies. If the bubble devices could be made three-dimensional the information density could be increased without increasing the equipment necessary to generate the rotating magnetic field. In line with the goal of decreasing costs a prime requirement is to increase the density of information storage. One method of increasing the information density is to decrease the bubble diameter. However, as the diameter of the bubbles is decreased, the size of the control lines which are necessary for selective bubble generation and bubble annihilation must also decrease. The difficulty in this approach lies in the fact that the current carrying requirement of these control lines is not decreased. A rule of thumb, employed in the art, is that above a current density of $10^6$ A/Cm$^2$ electromigration may occur which is capable of physically destroying the conductors. This obviously provides at least one limit to the state of the art in achievable information density.

Another method of increasing the amount of information is to merely increase the area occupied by the device. As has been pointed out above, however, a rotating magnetic field is required for propagation purposes in most magnetic bubble devices. Increasing the area occupied by the memory increases the size of the coils necessary to generate this magnetic field. As a result, increasing the area occupied by the memory does not decrease the per bit storage cost.

SUMMARY OF THE INVENTION

The present invention provides a three-dimensional magnetic bubble device which could be used for information storage. A plurality of pseudo-chip (as defined below) bubble devices are deposited on a flexible substrate. For this purpose the magnetic material is preferably an amorphous magnetic material. The necessary propagating means are deposited; a step which may use well-known techniques in the art and the interconnection conductors are deposited so as to connect each of the pseudo-chips into an array. Alternatively, propagating means may be provided which is not on the chip. This results in a two-dimensional array composed of a plurality of interconnected pseudo-chips each capable, for instance, of storing (that is writing and later reading) information in the form of magnetic bubbles. In order to form a three-dimensional magnetic bubble device the flexible substrate is then folded, preferably in two directions to provide a three-dimensional bubble device. Optionally, the process can be concluded by a low temperature lamination step, to unitize the structure and prevent it from unfolding.

Since the device thus produced is three dimensional the information which can be stored or manipulated in such device is many times larger than the information that could be stored in a two-dimensional array of the same area with constant size bubbles. This manner of fabricating a three-dimensional array also eases the interconnection problem. Each of the pseudo-chips can be interconnected with the other pseudo-chips in the array when the substrate is in a planar condition. Thus, this interconnection step can be carried out by automated equipment. It should be noted that this method of fabricating a three-dimensional bubble device provides a reduced number of external connections as compared with a three-dimensional bubble array comprising a plurality of different substrates. For instance, consider a flexible substrate which had deposited thereon 256 pseudo-chips in a 16 × 16 matrix. Such an arrangement might require 64 external connections. When properly folded, in accordance with the present invention, it would occupy an area equal to that of 16 pseudo-chips in a 4 × 4 matrix. However, consider the equivalent three-dimensional array comprised of 16 different substrates each with 16 pseudo-chips. Each of the substrates might require 16 external connections or a total of 256 external connections. Thus, it is apparent, that the three-dimensional bubble array in accordance with the teachings of the present invention has reduced the number of external connections by a factor of 4.

Those with ordinary skill in the art will understand that by increasing the amount of folding the equivalent area occupied by the memory can be further reduced. One of the most important considerations determining the cost of rotating field coils is the area encompassed by the coils. The three-dimensional array of my invention, by using a single substrate folded to give a plurality of substrate layers, multiplies the informational capability of the area encompassed by the coils, as compared with the single layer prior art devices. In this fashion the coils to generate the rotating magnetic field, necessary for bubble propagation, do not grow with increases in information storage capability. Clearly, the per bit storage cost of the three-dimensional magnetic bubble memory is reduced, as the third dimension of the memory grows.

BRIEF DESCRIPTION OF THE DRAWINGS

Accompanying this description are a plurality of drawings which, when taken in conjunction with this description describe preferred embodiments of the invention and in which.

DETAILED DESCRIPTION OF THE INVENTION

Figure 1:
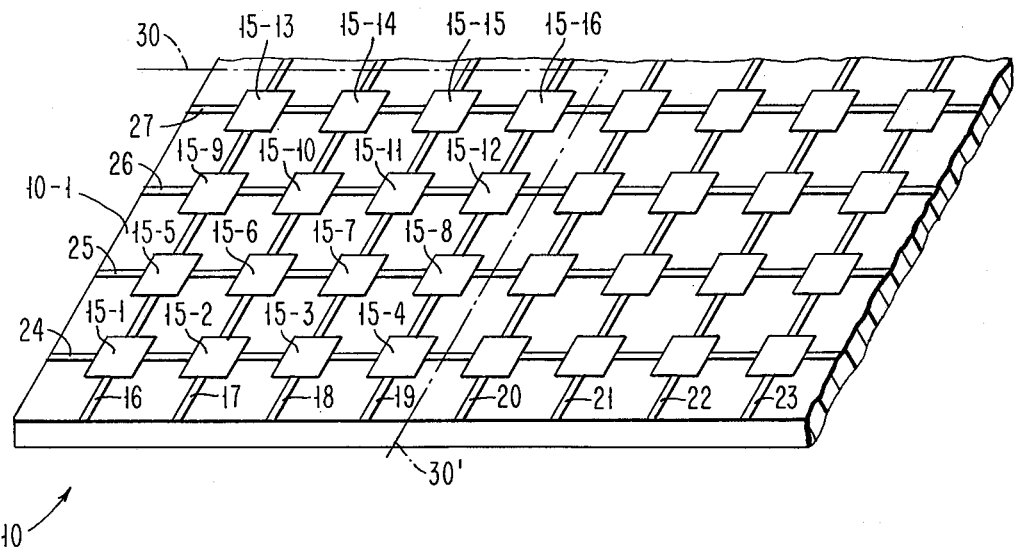
FIG. 1 is a plan view of a portion of a flexible substrate which has deposited on it a plurality of pseudo-chips in accordance with applicant's invention.

In FIG. 1, 10 is a portion of a thin flexible substrate suitable for folding. A suitable material for this substrate is mylar although other materials could be used. The thickness of the substrate may be varied to suit a particular situation. Since one goal is efficient space utilization, thick substrate is undesirable. On the other hand the substrate must be of sufficient thickness to perform the mechanical functions of supporting the pseudo-chips and conductors. Within these constraints a suitable substrate thickness may be selected. Deposited on this substrate are a plurality of amorphous metallic film areas 15. These areas 15 may be deposited in a regular matrix array although that is not essential to practicing this invention. In fact the film may be deposited across the entire face of the substrate. Suitable materials for the amorphous metallic films are disclosed by Chaudhari, Cuomo and Gambino in "Amorphous Metallic Films for Bubble Domain Applications," appearing in the January 1973 issue of the *IBM Journal of Research and Development*, beginning at page 66. Subsequent to the deposition of the film, suitable propagation means may be deposited adjacent the film areas. Usually the propagation means is deposited above the film although propagation means deposited at other locations relative to the film may also be used. Such a propagation means may, for instance, comprise a thin layer of permalloy patterns which are suitable for propagating bubbles in a rotating magnetic field as disclosed by Bobeck et al in "Magnetic Bubbles," appearing in the June 1971 issue of *Scientific American*, beginning at page 78. A suitable pattern can be that such as to provide a major-minor loop propagation arrangement illustrated in the afore-mentioned Bobeck et al article at page 90. Conventional bubble generating and sensing means may also be deposited. In some applications bubble generating means may not be necessary at all, such as, where bubbles are introduced in the manufacture and the device does not require bubble annihilation or generation. In addition, the bubble propagating and sensing means need not be directly on the chip devices but can be somewhat remote therefrom. Each of the amorphous metallic film areas cooperating with a suitable bubble propagation, generating and sensing means comprises what will be hereinafter referred to as a pseudo-chip, such as a pseudo-chip 15-1.

The term chip has become well defined in the art of integrated circuits. Thus, a large wafer may have a pattern of a plurality of integrated circuits deposited regularly there along in a manufacturing operation. After the manufacturing operation is complete the wafer is then cut to form a number of chips. Insofar as a regular pattern of circuit like components are deposited on a large substrate in accordance with the teachings of this invention each of these patterns or areas has chip-like characteristics. However, since the present invention does not contemplate any cutting, each of these areas is referred to as a pseudo-chip. In those applications where the entire substrate is covered by a bubble domain film the pseudo-chip areas are defined by the propagating and sensing means.

In addition to depositing the components which form the pseudo-chip, a plurality of interconnecting thin film conductors are also deposited upon the substrate, such as conductors 16 through 27. These conductors may connect with the generating and/or sensing means of the pseudo-chip. The conductors 16–27 then connect each of the pseudo-chips into a regular matrix for addressing and communication purposes.

Subsequent to depositing the afore-mentioned components, the flexible substrate is folded into two directions as will be explained in more detail hereinafter with respect to FIGS. 2 through 5.

Figure 2:
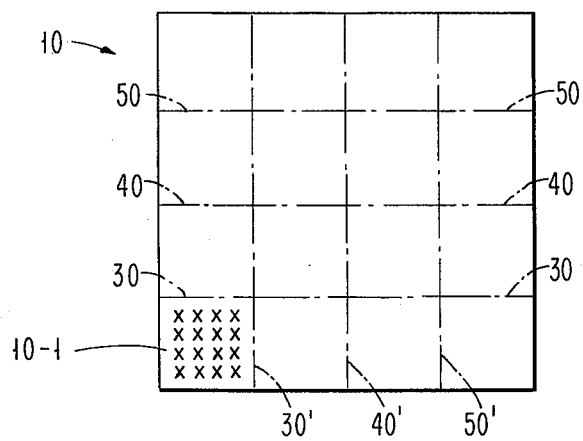
FIG. 2 is a plan view, schematically shown, of the entire substrate of FIG. 1.

FIG. 2 is a schematic plan view of the entire substrate 10 shown in FIG. 1 after the deposition of the components referred to above. Much of the details have been omitted; the conductors do not show up at all and the pseudo-chips are represented by small *x*'s in the portion 10-1 of substrate 10; the remaining pseudo-chips have been omitted for purposes of clarity. The portion 10-1 of the substrate 10 is defined by intersecting lines 30-30'. It will be understood that these are theoretical lines, shown for purposes of explanation only. At this point, the first folding operation occurs. In the example illustrated in FIG. 2 three folds are made respectively on lines 30, 40 and 50. Since each of the folds is made about an axis parallel to each of the other axes it is referred to as a folding in one direction. It should be understood that the showing of three folds, is merely exemplary as depending upon the size of the substrate and the desired final area to be occupied by the memory any reasonable number of folds can be effected. The folding may be consistently clockwise (when viewed on edge) or mixed clockwise and counterclockwise. The particular folding directions chosen may well have a bearing on the propagation pattern orientation, as will be explained hereinafter. However, my invention is not limited to a particular manner of folding.

Figure 3:
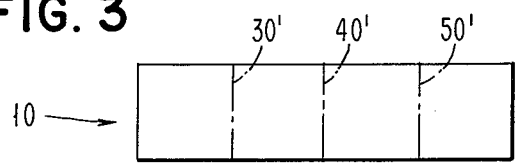
FIG. 3 is a schematic representation of an intermediate product resulting from folding the substrate, shown in FIG. 1, in one direction.

FIG. 3 is a schematic plan view of the intermediate product resulting from the folding operation just referred to. Again, the conductors and pseudo-chips have not been illustrated. At this point the second folding operation occurs, in a direction orthogonal to the direction of folding of the first folding step. In particular, three folds are made about the lines 30', 40' and 50'. As before, the number of folds made in this direction is subject to choice within predetermined limits. Again, since each of the folding axes is parallel to the others, this is referred to as folding in one direction.

Since one object of the invention is to efficiently utilize space the folding operations have been disclosed as taking place in orthogonal directions. However this is not essential and if, for some reason, folding in non-orthogonal directions is required this may be accomplished within the scope of my invention.

Figure 4:
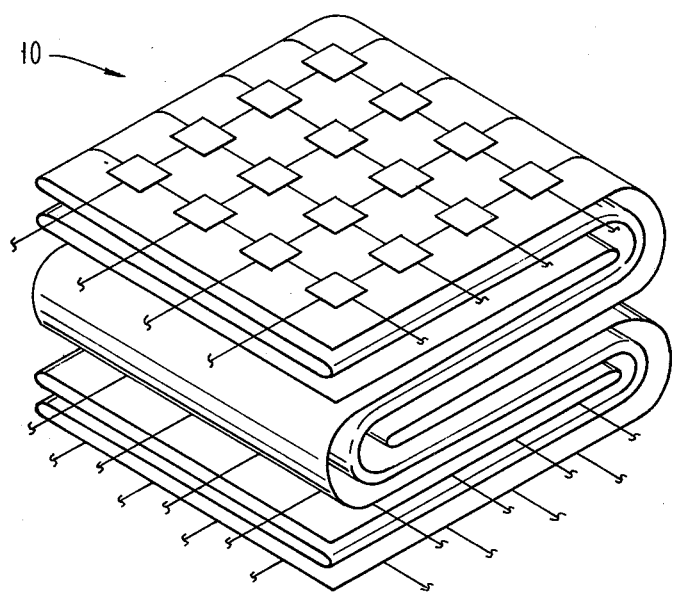
FIG. 4 is a schematic representation of the three-dimensional device in accordance with applicant's invention.

FIG. 4 illustrates an isometric view of the result and shows some of the external connections, others being omitted for clarity. As is clear from FIG. 4 the two folding steps have reduced the area of the memory to 1/16th of the wafer area. Subsequent to the second folding operation a low temperature lamination step may be employed. However, this is optional and is not essential to practicing this invention.

The amorphous metallic films used to support the magnetic bubbles are deposited using a relatively low temperature as compared with the prior art garnets which are deposited at a much higher temperature. The lamination step, if employed, must be effected at a temperature below that which may affect the amorphous metallic film. Suitably, the lamination step should be carried out at a temperature below the temperature used in depositing the amorphous metallic film or below the crystallization temperature of the amorphous metallic film. The lamination process may employ heat only or a suitable bonding agent may be employed. The laminated product is unitary and this may be desirable to prevent any tendency for the substrate to unfold.

Figure 5:
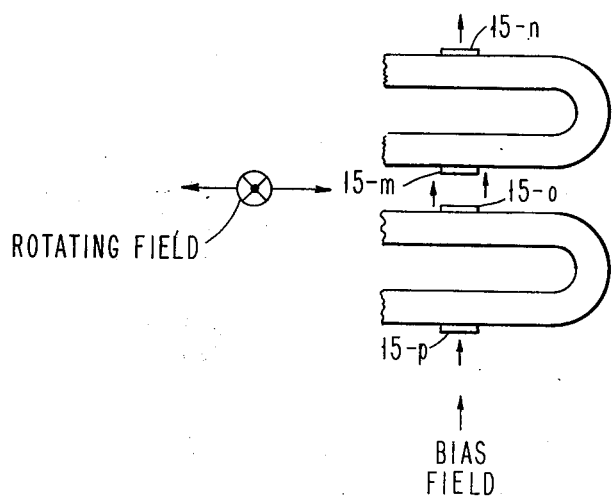
FIG. 5 is a partial fragmentary partial end view of FIG. 4.

FIG. 5 is a cross section of a portion of the modules shown in FIG. 4. Since each of the pseudo-chips must operate in a magnetic bias field which is common to all, they will all be magnetized in the same direction, such as the direction illustrated in FIG. 5. The rotating magnetic field, also shown in FIG. 5, rotates in a plane perpendicular to the plane of the drawing. Because of the folding step, however, some of the pseudo-chips will see the rotating magnetic field, which is employed for bubble propagation, as rotated 180° with respect to the manner in which the rotating magnetic field affects other of the pseudo-chips. For instance, pseudo-chips 15-*n* and 15-*o* will be affected by the magnetic field in like manner. To the contrary, however, the rotating magnetic field will act on pseudo-chips 15-*m* and 15-*p* in the opposite sense. This is for the reason that the pseudo-chips 15-*m* and 15-*p* are "upside down" with respect to other of the pseudo-chips. In order to accommodate this effect the same permalloy propagation patterns may be used but some must be rotated before deposition. One pattern with a selected orientation will be used for all pseudo-chips which are affected by the rotating magnetic field in the same sense. These pseudo-chips can easily be determined once the folding steps are predetermined. Other pseudo-chips will employ a permalloy propagation pattern which is rotated 180° with respect to the first mentioned pattern due to the "upside down" orientation. Still other patterns will be rotated 90° without being turned "upside down." In this regard, control signals and sensing signals will be time displaced from some pseudo-chips with respect to others. This, however, is beneficial allowing signal multiplexing.

Those skilled in the art will perceive that bubble domains are restricted to moving within one of a plurality of pseudo-chips. As a result the device does not require bubbles to cross "creases" in the substrate created during the folding steps.

From the foregoing it should be apparent that the magnetic bubble device disclosed herein is more efficient and thus exhibits a lower cost per bit than a three-dimensional magnetic bubble device of equivalent area fabricated by "stacking" a plurality of levels of pseudo-chips. The rotating magnetic field which is necessary for bubble propagation is more efficiently employed as compared with single layer bubble devices since the bubble device dimension has been vertically increased. Thus, the three-dimensional device has a greater informational capability than the two-dimensional device for devices of equal rotating field coil size.

By employing a continuous flexible substrate it is possible to have the interconnections between pseudo-chips deposited using a thin film conductor applied by automatic machinery. The advantages over merely stacking separate bubble memory planes should be apparent. It is a simple matter to calculate for the 16 × 16 pseudo-chip array, a portion of which is illustrated in FIG. 1, 64 external connections are required. In contrast, stacking 16 levels of magnetic bubble memories, each of which carries a 4 × 4 pseudo-chip array would require 256 external connections.

Although the present invention has been disclosed as employing permalloy patterns for a propagation arrangement other propagation means could be employed, as well. Such means are well known in the art. Furthermore, although the drawings illustrate a regular array of pseudo-chips this is, of course, not a necessry feature of the present invention. If, for some reason an irregular array was desired it could easily be accommodated. In addition, the particular amorphous metallic films employed for supporting the magnetic bubbles need not be the magnetic films referred to hereinbefore, but other magnetic films could be used, as well.

Typical parameters for a memory module illustrated herein are as follows:

The substrate could comprise a 1 mil thick mylar, 10 inches on each side. With three folds in each direction, as shown in FIGS. 2 and 3, the resulting module, shown in FIG. 4, would occupy an area 2½ inches square, and slightly less than 20 mils thick. With bubble diameter of 2 microns each pseudo-chip would have on the order of $10^6$ bit capacity.

What I claim is:

1. A three-dimensional magnetic apparatus characterized by a plurality of magnetic bubble supporting regions located on a continuous substrate wherein said substrate is folded on itself to form said three-dimensional apparatus and means for providing a magnetic field for supporting and propagating magnetic bubbles in said regions which is common to all said regions.

2. A three-dimensional magnetic bubble device comprising,
   a continuous flexible substrate folded on itself providing at least one layer overlying at least one other layer,
   a plurality of pseudo-chips deposited on said flexible substrate, each of said pseudo-chips comprising a material suitable for supporting magnetic bubbles,
   thin-film interconnection means between at least some of said pseudo-chips, and
   means for providing a common magnetic field for supporting and propagating bubbles in said pseudo-chips, said common magnetic field common to all said pseudo-chips.

3. The device of claim 2 in which said pseudo-chips comprise amorphous metallic films.

4. The device of claim 2 in which said substrate is mylar.

5. The device of claim 2 in which each of said pseudo-chips further include include propagation means for said bubbles.

6. The device of claim 5 in which each of said pseudo-chips includes means for generating and sensing bubbles.

7. The device of claim 5 in which said interconnection means interconnect said sensing means.

* * * * *